United States Patent
Keck

(10) Patent No.: US 11,700,057 B2
(45) Date of Patent: *Jul. 11, 2023

(54) MULTI-LANE OPTICAL-ELECTRICAL DEVICE TESTING USING AUTOMATED TESTING EQUIPMENT

(71) Applicant: OpenLight Photonics, Inc., Goleta, CA (US)

(72) Inventor: Steven William Keck, Mountain View, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,129

(22) Filed: Jul. 15, 2022

(65) Prior Publication Data
US 2022/0352981 A1   Nov. 3, 2022

Related U.S. Application Data

(63) Continuation of application No. 16/943,377, filed on Jul. 30, 2020, now Pat. No. 11,411,644.

(51) Int. Cl.
*H04B 10/073* (2013.01)
*G01R 31/28* (2006.01)

(52) U.S. Cl.
CPC ..... *H04B 10/0731* (2013.01); *G01R 31/2889* (2013.01)

(58) Field of Classification Search
CPC ............ G01R 31/2648; G01R 31/2656; G01R 31/2831; G01R 31/2889; G01R 31/308; G01R 31/311; H04B 10/0731; H04B 10/40
See application file for complete search history.

(56) References Cited

U.S. PATENT DOCUMENTS

| | | | |
|---|---|---|---|
| 5,041,997 A * | 8/1991 | Hernday | G01M 11/333 356/73.1 |
| 11,411,644 B2 * | 8/2022 | Keck | G01R 1/071 |
| 2006/0203228 A1 | 9/2006 | Niki | |

(Continued)

FOREIGN PATENT DOCUMENTS

| | | |
|---|---|---|
| CN | 114061904 A | 2/2022 |
| JP | 2022027373 A | 2/2022 |
| TW | 202205466 A | 2/2022 |

OTHER PUBLICATIONS

"U.S. Appl. No. 16/943,377, Non Final Office Action dated Nov. 23, 2021", 15 pgs.

(Continued)

*Primary Examiner* — Jermele M Hollington
*Assistant Examiner* — Suresh K Rajaputra
(74) *Attorney, Agent, or Firm* — Schwegman Lundberg & Woessner, P.A.

(57) ABSTRACT

A hybrid automated testing equipment (ATE) system can simultaneously test electrical and optical components of a device under test, such as an optical transceiver. The device under test can be a multilane optical transceiver that transmits different channels of data on different lanes. The hybrid ATE system can include one or more light sources and optical switches in an optical test lane selector to selectively test and calibrate each optical and electrical components of each lane of the device under test.

20 Claims, 8 Drawing Sheets

(56) References Cited

U.S. PATENT DOCUMENTS

| | | | |
|---|---|---|---|
| 2007/0171399 A1* | 7/2007 | Froggatt | G01N 21/21 |
| | | | 356/73.1 |
| 2014/0092394 A1 | 4/2014 | Detofsky et al. | |
| 2016/0334575 A1* | 11/2016 | Graves | G02B 6/126 |
| 2022/0038176 A1 | 2/2022 | Keck | |

OTHER PUBLICATIONS

"U.S. Appl. No. 16/943,377, Notice of Allowance dated Mar. 30, 2022", 12 pgs.

"U.S. Appl. No. 16/943,377, Response filed Feb. 18, 2022 to Non Final Office Action dated Nov. 23, 2021", 12 pgs.

"European Application Serial No. 20203090.4, Extended European Search Report dated Mar. 30, 2021", 8 pgs.

"Thailand Application Serial No. 2001006143, Notifications of Reasons for Refusal dated Nov. 25, 2022", with Concise Statement of Relevance, 4 pages.

* cited by examiner

MULTI-LANE OPTICAL-ELECTRICAL DEVICE TESTING USING AUTOMATED TESTING EQUIPMENT

PRIORITY

This application is a continuation of U.S. patent application Ser. No. 16/943,377 filed Jul. 30, 2020, which is incorporated by reference herein in its entirety.

TECHNICAL FIELD

The present disclosure generally relates to circuit testing, and more particularly to optical-electrical device testing.

BACKGROUND

Modern high-speed integrated circuits (ICs) have complex architectures, with millions of components such as transistors that must operate in concert to transmit data at multi-gigabit data rates required by modern communication networks. One of the critical steps of manufacturing such devices is the testing and calibration of the high-speed devices to ensure the devices do not fail at a later point in time (after integration into a product). One issue with testing and calibration of such high-speed devices stems from the modern design process, in which different components of the device are designed by different companies as "off the shelf" components. To this end, automatic test equipment (ATE) can be implemented by the device engineers to efficiently test high-speed designs at the chip and wafer level. Generally, an ATE system includes one or more computer-controlled equipment or modules that interface with the device under test (DUT) to perform stress testing and analyze individual components with minimal human interaction. Current ATE systems that are configured for electronic or semiconductor devices are not configured to provide rapid testing and calibration of some modern hybrid high-speed devices, such as multi-lane gigabit optical transceivers that process multiple lanes of electrical data and light to achieve high data rates.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Figure 1:
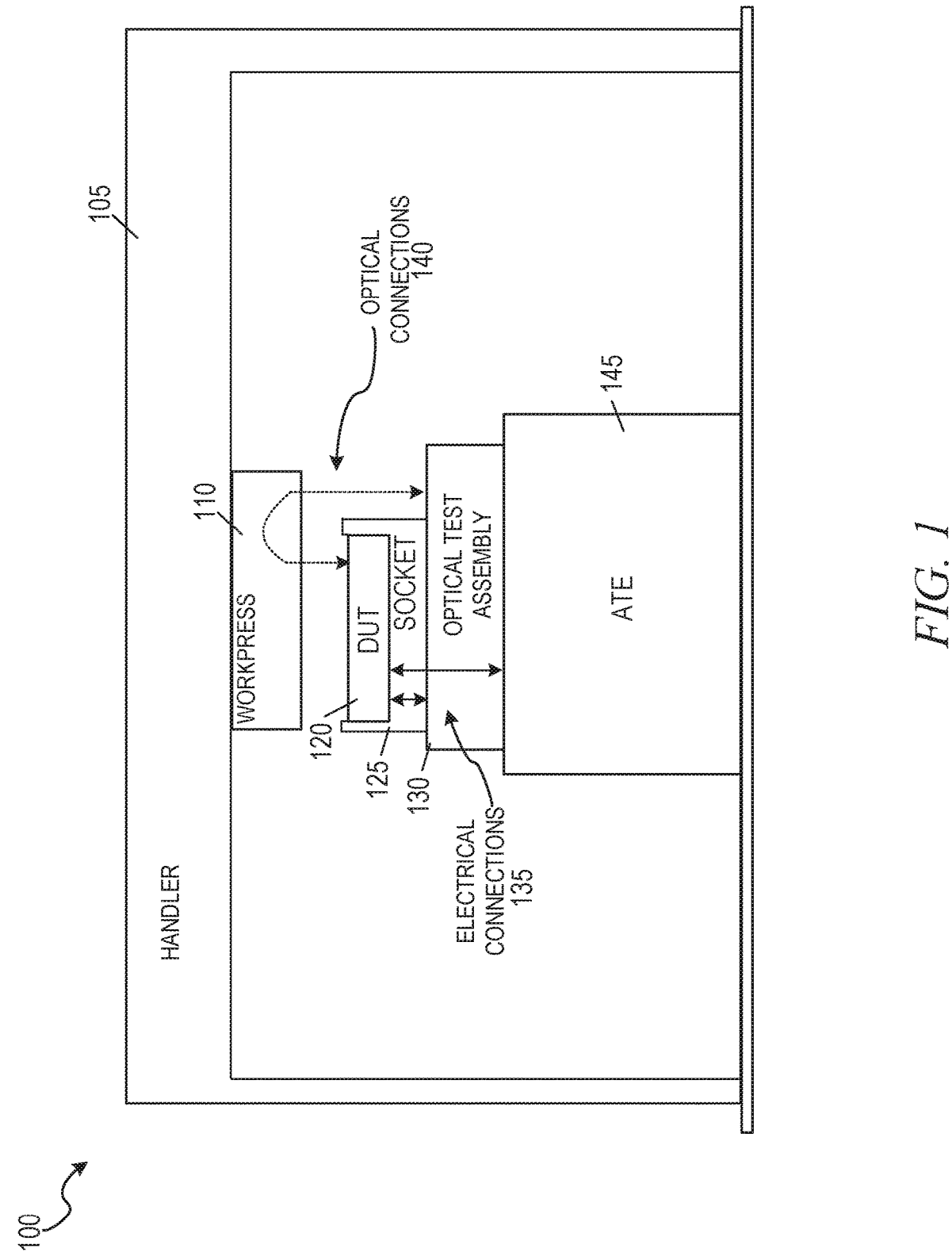
FIG. 1 is a diagram showing an optical and electrical testing system for implementing reconfigurable multi-lane hybrid testing of photonic devices, according to some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

Modern ATE systems are not configured to rapidly test, validate, and calibrate modern hybrid high-speed devices, such as multi-lane optical transceivers (e.g., 400 G (gigabits per second) optical transceiver), which include both complex electrical and optical modules. To this end, a hybrid optical-electrical ATE system can be implemented that uses one or more electrical interfaces to interface with electrical test devices of the ATE system and one or more optical interfaces (e.g., fibers, lens, gratings) to interface with optical test devices of the ATE system. In some example embodiments, the hybrid optical-electrical ATE system is implemented by augmenting an electrical ATE system an off-the-shelf electrical ATE system) with an optical test assembly to interface one or more testing devices (e.g., an optical spectrum analyzer, an optical power meter) with an optical-electrical device under test (DUT). The optical test assembly can include a socket with physical alignment features that align with alignment features of an optical interconnection head. The optical interconnection head can be implemented as a ferrule adapter that interconnects one or more fibers from the optical devices (e.g., test modules, light sources) with the optical-electrical DUT. In some example embodiments, the optical-electrical DUT is electrically connected to the electrical ATE system using an electrical interface of the electrical ATE system, while the optical connections are input via the optical interconnection head to the opposite side of the optical-electrical DUT (e.g., a bottom-side of the optical-electrical DUT in a flip-chip configuration, where the top-side rests on the test bench and electrical interconnections of the ATE electrical interface).

To perform hybrid testing, the optical-electrical ATE system can include an external broadband light source that injects light into one or more single mode fibers to the receive interface of the optical-electrical DUT. Each of the single mode fibers that input light into the optical-electrical DUT corresponds to individual lane of a multi-lane optical transceiver DUT having a plurality of lanes or channels (e.g., four 100 G lanes for a combined 400 G data rate). The optical-electrical DUT can include multiple receiver/transmitter pairs for each lane, each pair receive light to transmit (e.g., from the external light source), modulate the received light, and transmit the modulated light to different network destinations using a common output interface of the optical-electrical DUT (e.g., four output ports or fibers).

In operation, the optical-electrical DUT can operate all four lanes simultaneously, thereby achieving high speed data rates. However, to efficiently test and calibrate the multi-lane DUT, in some example embodiments, the hybrid optical-electrical ATM system tests each lane individually by inputting light into the lane-under-test and selecting output light from the lane-under-test to a testing device using an optical switch (e.g., a 1×4 optical switch, a mechanical switch, an thermo-optic switch, a Mach-Zehnder Interferometer based switch). For example, the optical-electrical ATE system uses the broadband light source to generate light for the first input fiber lane, which the first lane components of the optical-electrical DUT modulate and output on the first output fiber, where all of the output fibers from the DUT are coupled to the optical switch. The optical switch selector is configured to couple the first output fiber to a testing fiber (e.g., single mode fiber) that is coupled to the optical testing devices. After the components of the first lane are calibrated, the second input fiber can receive light (e.g., from the broad band light source) for modulation, and output the modulated light to the optical switch. The optical switch receives the modulated light for the second lane and couples the light to the test fiber for testing by the one or more optical test devices for testing, analysis and calibration. In this way, each lane of the optical-electrical DUT can undergo simultaneous electrical and optical calibration using electrical ATE test devices and optical test devices in an efficient approach.

FIG. 1 shows an optical and electrical testing system 100 for implementing reconfigurable multi-lane hybrid testing of optical-electrical devices, according to some example embodiments. As illustrated, a handler 105 (e.g., integrated circuit (IC) handler, chip hander) is a robotic system that can precisely move an optical-electrical device under test (DUT) 120 into position for simultaneous optical and electrical testing and calibration. A workpress 110 (e.g., a workpress assembly) is attached to the handler 105 to move the DUT 120 to the test socket base 125. The workpress 110 can attach to the DUT 120 using different means, such as a mechanical gripping device, a socket, or vacuum suction, according to some example embodiments.

The test socket base 125 is further positioned on an optical test assembly 130, which provides optical testing of the DUT 120 using one or more optical analysis modules (e.g., an optical spectrum analyzer, optical power meter), and an electrical automated test equipment (ATE) 145, which provides electrical automated testing using one or more electrical analyzer modules. The DUT 120 is electrically connected via electrical connections 135 (e.g., high speed test socket base 125) to the optical test assembly and the ATE 145. Furthermore, the DUT 120 can interface optically with the optical test assembly using one or more optical connections 140. For example, the optical connections 140 can be implemented as optical paths that extend from the optical test assembly 130 into the workpress 110, and back towards the topside of the DUT 120 (e.g., which can be a top side, or "bottom side" in a flip chip configuration where the "top side" faces towards an interposer or host board). The ATE 145 can be an "off the shelf" ATE unit that is designed only for electrical DUT testing. By implementing the optical test assembly and the optical connections 140, the testing ability of the ATE unit is augmented with optical analysis capabilities that enable efficient and accurate simultaneous electrical and optical testing of DUTs. Further functional components and details of the optical test assembly are discussed in further detail below.

Figure 2:
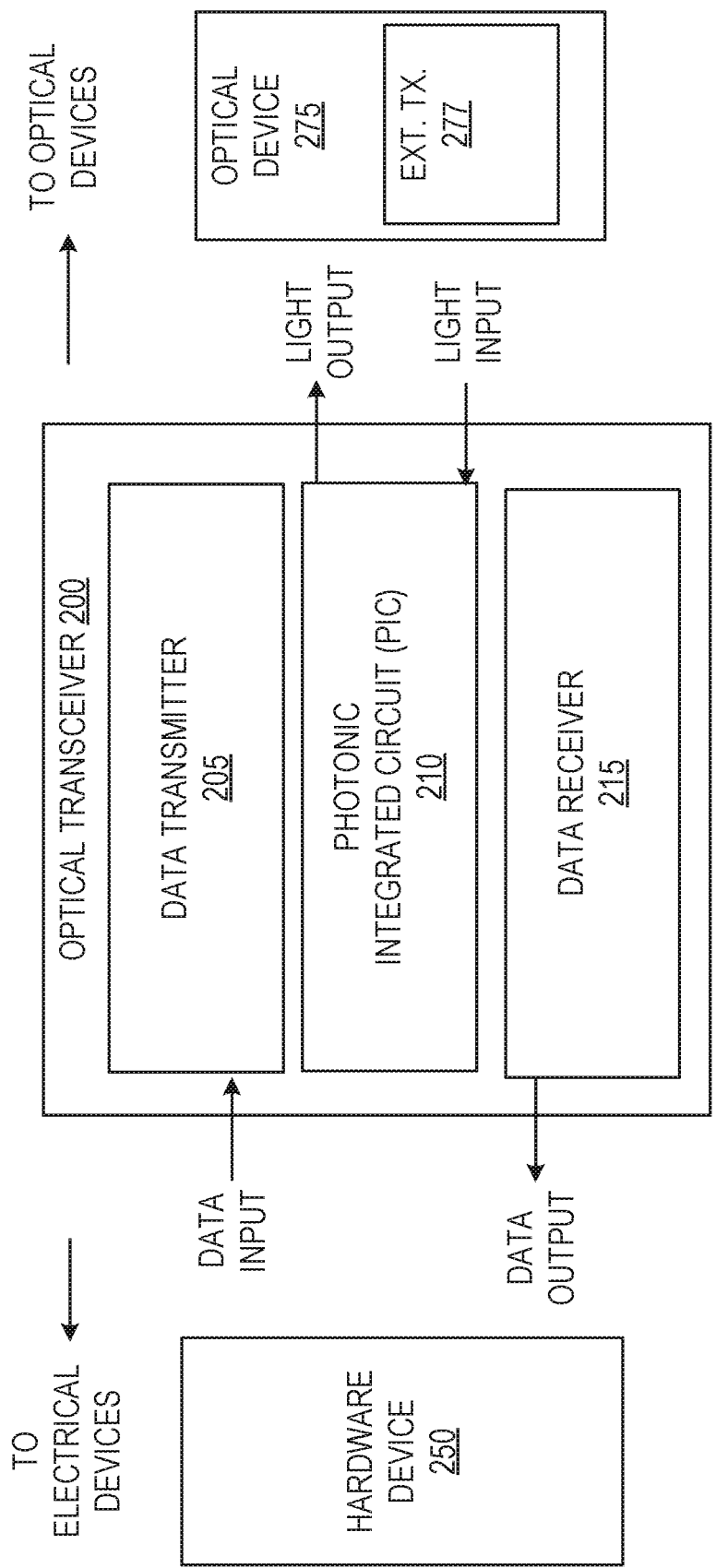
FIG. 2 is a block diagram illustrating an optical transceiver for transmitting and receiving optical signals, according to some example embodiments.

FIG. 2 is a block diagram illustrating an optical transceiver 200 for transmitting and receiving optical signals, according to some example embodiments. The optical transceiver 200 is an example hybrid optical-electrical device that can undergo simultaneous multi-lane selectable testing and calibration (e.g., DUT 120, FIG. 1). As illustrated, the optical transceiver 200 can be implemented to interface electrical data from electrical devices, such as electrical hardware device 250, convert the electrical data into optical data, and send and receive the optical data with one or more optical devices, such as optical device 275. For explanatory purposes, in the following description the electrical hardware device 250 is a host board that "hosts" the optical transceiver 200 as a pluggable device that sends and receives data to an optical switch network; where, for example, optical device 275 can be other components of an optical switch network (e.g., external transmitter 277). However, it is appreciated that the optical transceiver 200 can be implemented to interface with other types of electrical devices and optical devices. For instance, the optical transceiver 200 can be implemented as a single chip on a hybrid "motherboard," that uses an optical network (e.g., waveguides, fibers) as an optical bus to interconnect on-board electrical chips that process the data after it is converted from light into binary electrical data, according to some example embodiments.

In some example embodiments, the hardware device 250 includes an electrical interface for receiving and mating with an electrical interface of the optical transceiver 200. The optical transceiver 200 may be a removable front-end module that may be physically received by and removed from hardware device 250 operating as a backend module within a communication system or device. The optical transceiver 200 and the hardware device 250, for example, can be components of an optical communication device or system (e.g., a network device) such as a wavelength-division multiplexing (WDM) system that can implement different types of multi-lane optical communication formats (e.g., parallel-single fiber (PSM), formats defined by IEEE 802.3, including, for example: 400 GBASE-FR4, 40 GBASE-LR4, 40 GBASE-ER4).

The data transmitter 205 of the optical transceiver 200 can receive the electrical signals, which are then converted into optical signals via PIC 210. The PIC 210 can then output the optical signals via optical links, such as fiber or waveguides that interface with the PIC 210. The output light data can then be processed by other components (e.g.; switches, endpoint servers, other embedded chips of on a single embedded system), via a network such as a wide area network (WAN), optical switch network, optical waveguide network in an embedded system, and others.

The optical transceiver 200 can receive high data rate optical signals via one or more optical links to optical device 275. The optical signals are converted by the PIC 210 from light into electrical signals for further processing by data receiver 215, such as demodulating the data into a lower data rate for output to other devices, such as the electrical hardware device 250. The modulation used by the optical transceiver 200 can include pulse amplitude modulation (e.g., PAM4), quadrature phase-shift keying (QPSK), binary phase-shift keying (BPSK), polarization-multiplexed BPSK, M-ary quadrature amplitude modulation (M-QAM), and others.

Figure 3:
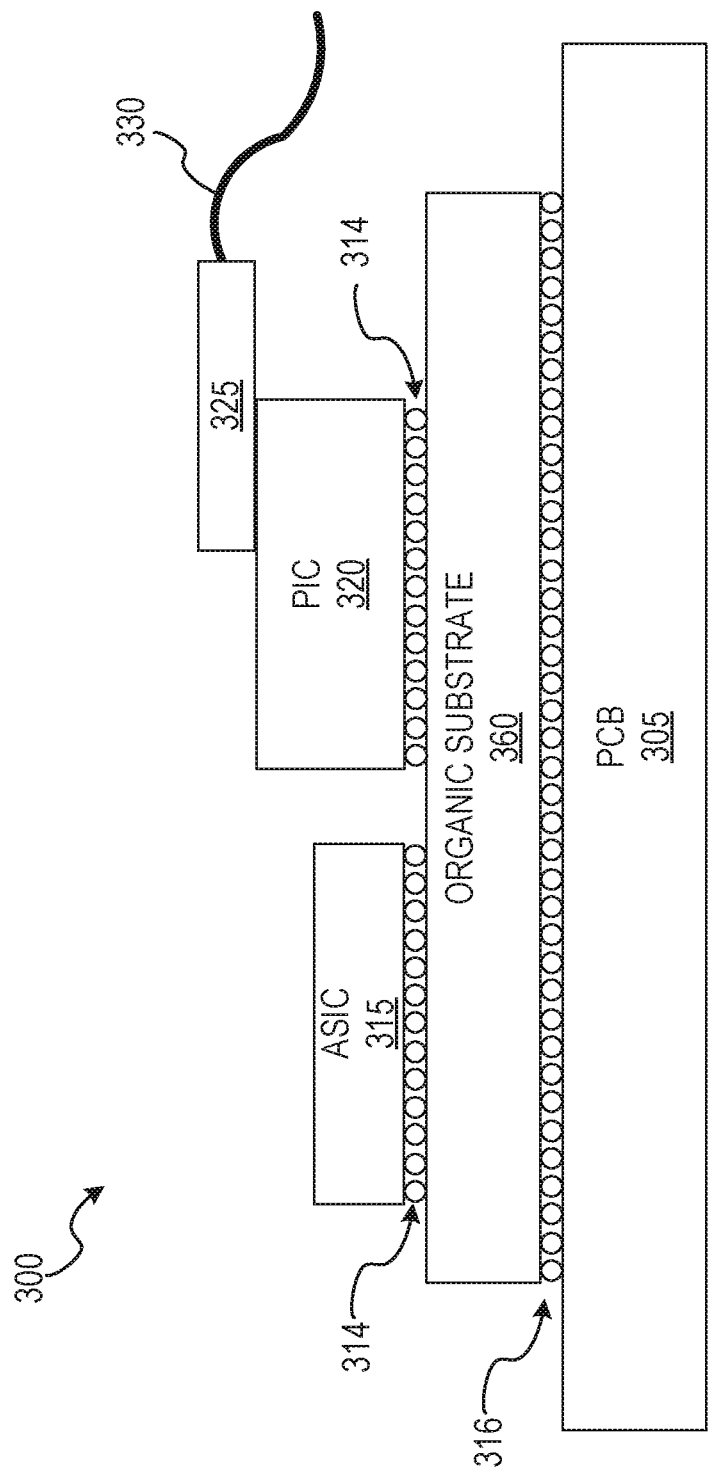
FIG. 3 is an illustration of an optical-electrical device including one or more photonic structures, according to some example embodiments.

FIG. 3 is an illustration of an optical-electrical device 300 (e.g., optical transceiver) including one or more optical devices according to an embodiment of the disclosure. The optical-electrical device 300 is an example of an optical transceiver 200 configured as a multi-chip structure. In this embodiment, the optical-electrical device 300 includes printed circuit board (PCB) 305, organic substrate 360, ASIC 315, and photonic integrated circuit (PIC) 320. In this embodiment, the PIC 320 may include one or more optical structures described above. In some example embodiments, the PIC 620 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GainAsN)). The carrier dispersion effects of III-V-based materials may be significantly higher than in silicon-based materials, as electron speed in III-V semiconductors is much faster than that in silicon. In addition. III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as iron, cobalt, or yttrium iron garnet (YIG). Further, in some example embodiments, crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalite (LiTaO3).

In the example illustrated, the PIC 320 exchanges light with fiber 330 via prism 325; said prism 325 is a misalignment-tolerant device used to couple an optical mode to one or more single-mode optical fiber (e.g., four transmit fibers, four receive fibers), according to some example embodiments. In other example embodiments, multiple fibers are implemented to receive light from the prism 325 for various optical modulation formats.

In some example embodiments, the optical devices of PIC 320 are controlled, at least in part, by control circuitry included in ASIC 315. Both ASIC 315 and PIC 320 are shown to be disposed on copper pillars 314, which are used for communicatively coupling the ICs via organic substrate 360. PCB 305 is coupled to organic substrate 360 via ball grid array (BOA) interconnect 316, and may be used to interconnect the organic substrate 360 (and thus, ASIC 315 and PIC 320) to other components of optical-electrical device 300 not shown—e.g., interconnection modules, power supplies, etc.

Figure 4:
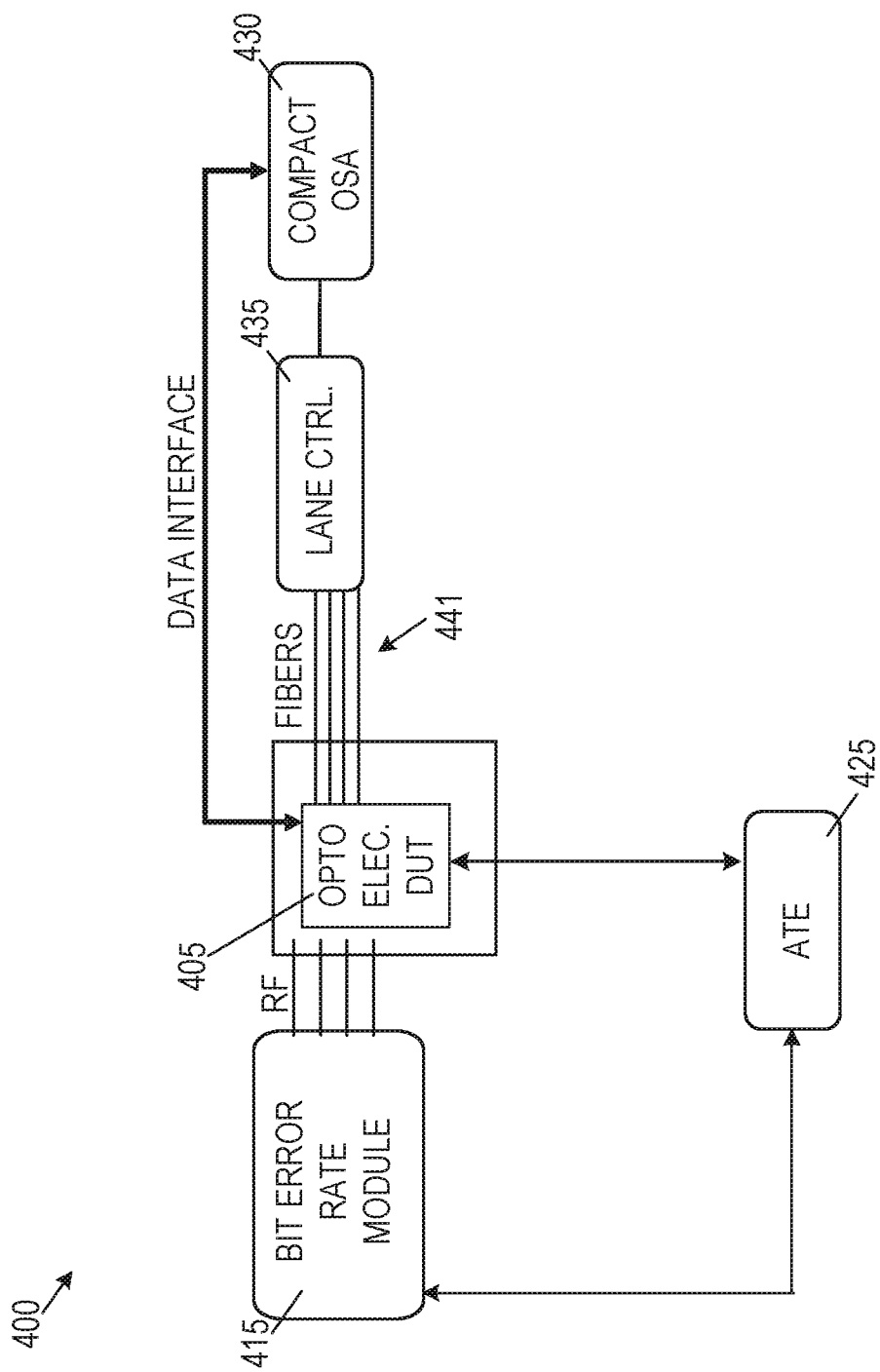
FIG. 4 displays an optical-electrical ATE architecture, according to some example embodiments.

FIG. 4 displays an optical-electrical. ATE architecture 400, according to some example embodiments. The optical-electrical ATE architecture 400 is an example implementation of the optical test assembly 130 for optical testing and calibration of optical devices. At a high level, the ATE 425 interfaces with the optical electrical device under test 405 and a hit error rate module 415 (e.g., an embedded BER tester). Further, and in accordance with some example embodiments, the ATE 425 can interface and display data from a compact OSA 430 that interfaces electrically with the DUT 405 using a data interface (e.g., an RS-232 interface), and optically via one or more fibers and an optical test lane controller. In some example embodiments, the DUT 405 receives light from the plurality of fibers 441 (e.g., one of four light injection fibers), and generates different modulated light beams (e.g., at different wavelengths, or on different channels) that output onto one or more of the plurality of fibers 441 (e.g., one or more of the output fibers 530A-530D). In those example embodiments, the optical test lane controller is operable to select one of the available plurality of fibers for output to optical testing devices, such as the OSA 430.

Figure 5:
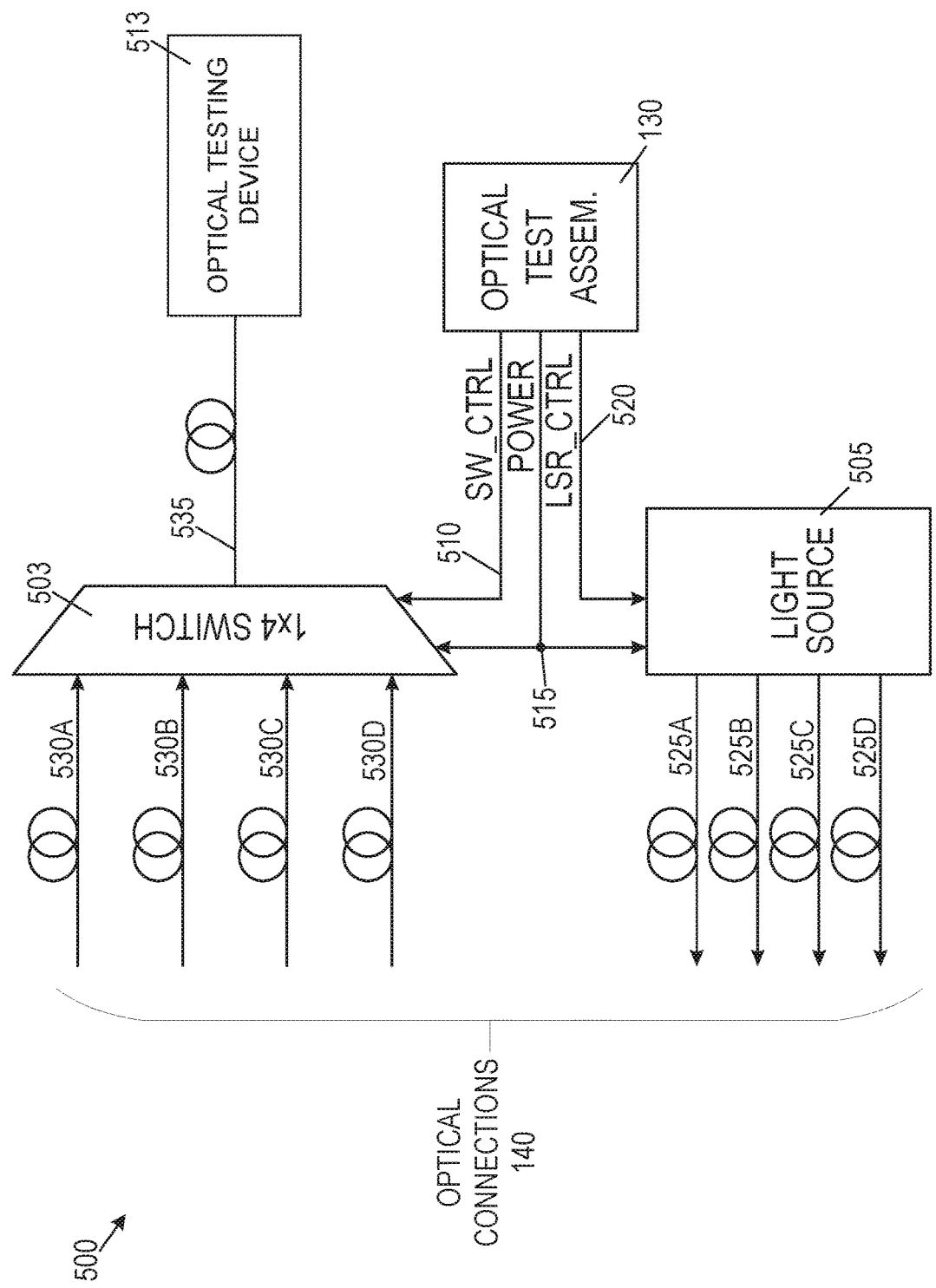
FIG. 5 shows an example multilane optical test lane controller architecture, according to some example embodiments.

FIG. 5 shows an example optical test lane controller architecture 500 (e.g., optical test lane controller 435), according to some example embodiments. In some example embodiments, the optical test lane controller architecture 500 comprises an optical switch 503, a light source 505, and an optical test device 513, which can be integrated into the optical test assembly 130 according to some example embodiments. In some example embodiments, the optical switch 503, the light source 505, and the optical test device 513 are external modules that are connected to the optical test assembly via optical and electrical connections, such as electrical cables and fibers.

In the example illustrated, the optical test assembly 130 is connected with the switch 507 and the light source 505 using electrical connections, such as switch control path 510, power path 515 and laser control path 520. The switch control path 510 is operable to control which lane of the optical switch 503 is selected for coupling to a testing fiber 535 which is coupled to the optical test device 513. In some example embodiments, the optical switch 503 is implemented as a mechanical switch that selects one of the fibers 530A-530D for coupling into the testing fiber 535 using mechanical switches (e.g., MEMS optical switch) or non-mechanical switches, such as one or more couplers (e.g., MZI) that select one of the fibers 530A-530D for output to testing fiber 535.

In some example embodiments, the light source 505 comprises a plurality of external lasers, where each laser is configured to generate light for one of the fibers 525A-525D. In other example embodiments, the light source 505 comprises a broadband tunable light source that can be tuned for different wavelengths and power characteristics to generate light for any of the fibers 525A-525D.

The light generated by light source 505 is input into the DUT 120 (not depicted) using the plurality of input fibers 525A-525D. In some example embodiments, the plurality of output fibers 530A-530D and the plurality of input fibers 525A-525D are grouped together as the optical connections 140 which are input to the DUT 120 using an optical interconnect assembly, discussed in further detail below with reference to FIG. 6A and FIG. 6B.

To perform simultaneous hybrid testing and calibration of the DUT 120, the optical test lane controller architecture 500 activates one lane at a time, sequentially. For example, in a first configuration, the optical test assembly 130 uses switch control path 510 to configure the optical switch 503 to couple the output fiber 530A to the testing fiber 535. Further, the optical test assembly 130 uses the laser control path 522 to activate light source 505 for the first lane to transmits light into the device under test using the input fiber 525A for the first lane. While in the first configuration, electrical components can be tested using ATE 145, while the optical test assembly 130 uses the optical test device 513 to test and calibrate components of the first lane. For example, the light source 505 generates a first laser light which is injected into the DUT using input fiber 525A. The data transmitter and optical modulators for the first lane then modulate the received light according to a modulation format (e.g., PAM4) and the modulated late is then output by the device under test onto the output fiber 530A. The optical switch 503 then couples the modulated light from the fiber 530A to the testing fiber 535 for analysis and calibration of components of the first lane (e.g., heater settings of the data transmitter for the first lane, modulator bias settings for an optical modulator for the first lane, etc.). Further details of hybrid testing and calibration of the device under test using an optical-electrical ATE system are discussed in application Ser. No. 16/907,857, titled "Optical Transceiver Loopback Eye Scans," filed on Jun. 22, 2020; and application Ser. No. 16/887,668, titled "Optical-Electrical Device Testing Using Hybrid Automated Testing Equipment," filed on May 29, 2020, which are hereby incorporated by reference in their entirety.

After the first lane of the device under test is calibrated, the optical test lane controller architecture 500 can switch into a different configuration to test the other lanes. For example, the optical test lane controller architecture 500 can configure the light source 505 to generate light on the second lane 525B and configure the switch to couple light from the output fiber 530B to the testing fiber 535 for testing and calibrating using electrical and optical test devices. Similarly, additional lanes can be tested by using the optical test lane controller architecture 500 to sequentially activate the light source 505 to generate onto one of the input fibers 525A-525D to inject light into the DUT and configure the optical switch 503 to couple modulated light received one of the output fibers 530A-530D onto the testing fiber 535 for testing and calibration.

Figure 6A:
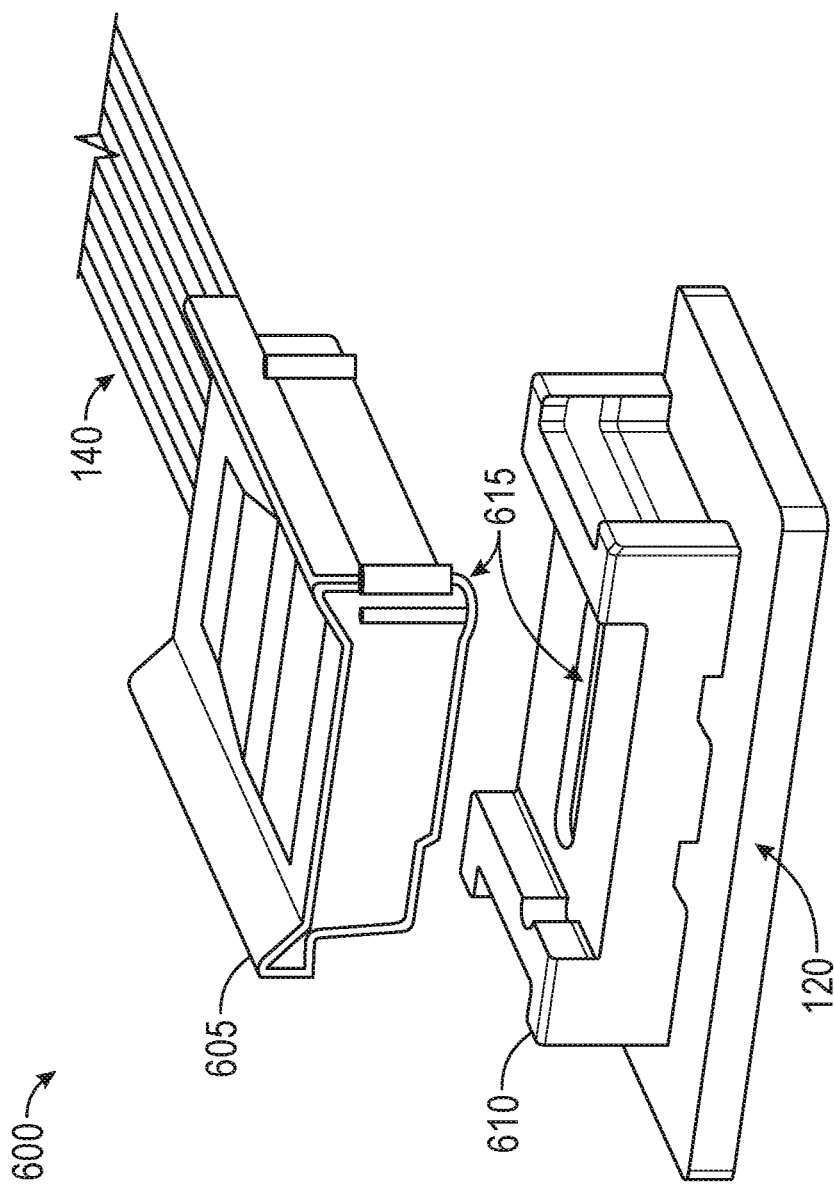
FIG. 6A is a diagram showing a perspective view of an optical interconnect interface, according to some example embodiments.

FIG. 6A shows a perspective view of an optical interconnect interface 600, according to some example embodiments. The optical interconnect interface 600 is operable to input and output light into the DUT 120 from the optical connections 140 (e.g., eight single mode fibers). In some example embodiments, the optical interconnect interface 600 comprises an optical interconnection head. 605 (e.g., plug, socket, ferrule) that attaches to an optical interconnection receptacle 610. The receptacle 610 can be attached to the DUT 120 to couple light into the DUT 120. The optical interconnection head 605 and the optical interconnection receptacle 610 have corresponding alignment features 615 that interlock. In some example embodiments, the optical interconnection head 605 is attached to the workpress 110. The workpress 110 is actuated into position by the handler 105 such that the alignment features 615 align and interlock in a passive alignment process. That is, for example, by aligning the optical interconnection head 605 to the optical interconnection receptacle 610 using the alignment features 615, the output fibers 530A-530D in the optical connections 140 are aligned with output gratings of the DUT 120 (e.g., that generator modulated light), and the input fibers 525A-530A in the optical connections 140 are aligned with input gratings of the DUT 120 (e.g., to inject light from the light source 505 into the device under test).

Figure 6B:
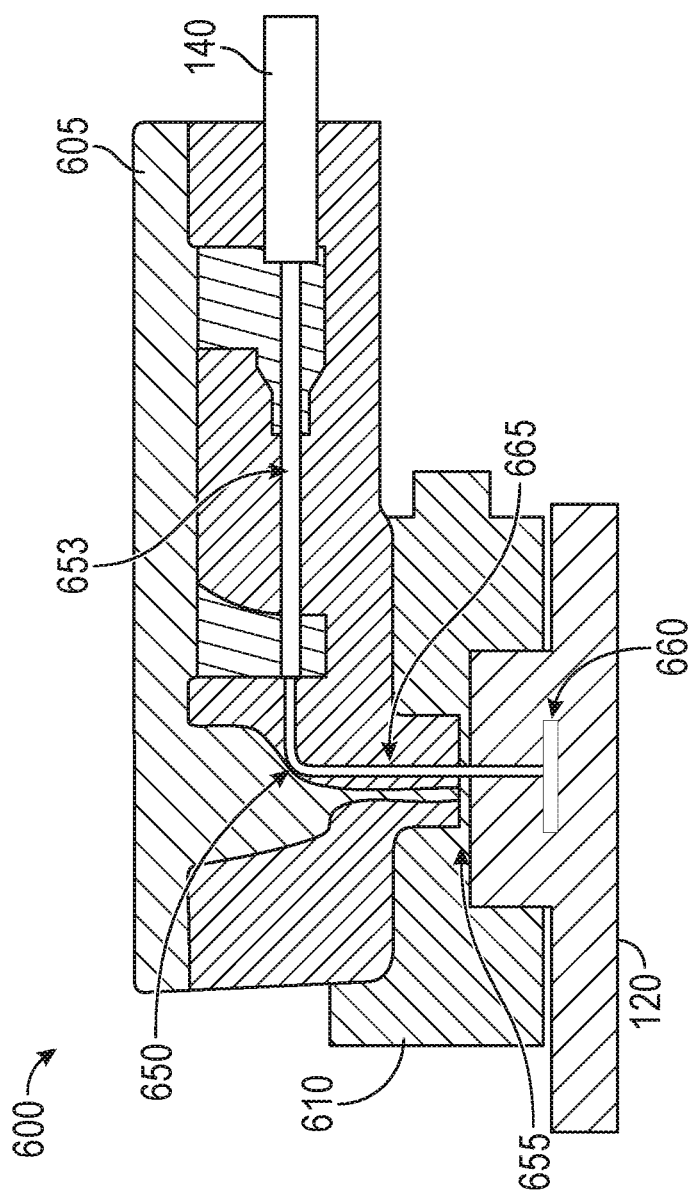
FIG. 6B is a diagram showing the side cut-away view of the optical interconnect interface, according to some example embodiments.

FIG. 6B shows the optical interconnect interface 600 from a side view that illustrates one or more internal components of the optical interconnect interface 600, according to some example embodiments. In the example of FIG. 6B, the optical interconnection head 605 has been interlocked with the optical interconnection receptacle 610 such that light from the optical connections 140 can be coupled to the DUT 120. In the example illustrated, the optical connections within the optical interconnection head 605 are each single mode fibers 653 that transmit light which reflects off a lens 650 towards a beam path 665 (e.g. an internal waveguide, a fiber) The beam path 665 transmits the light towards a one or more lenses 655 (e.g. a micro-lens array) which directs the light towards a grating 660 of the DUT 120.

Figure 7:
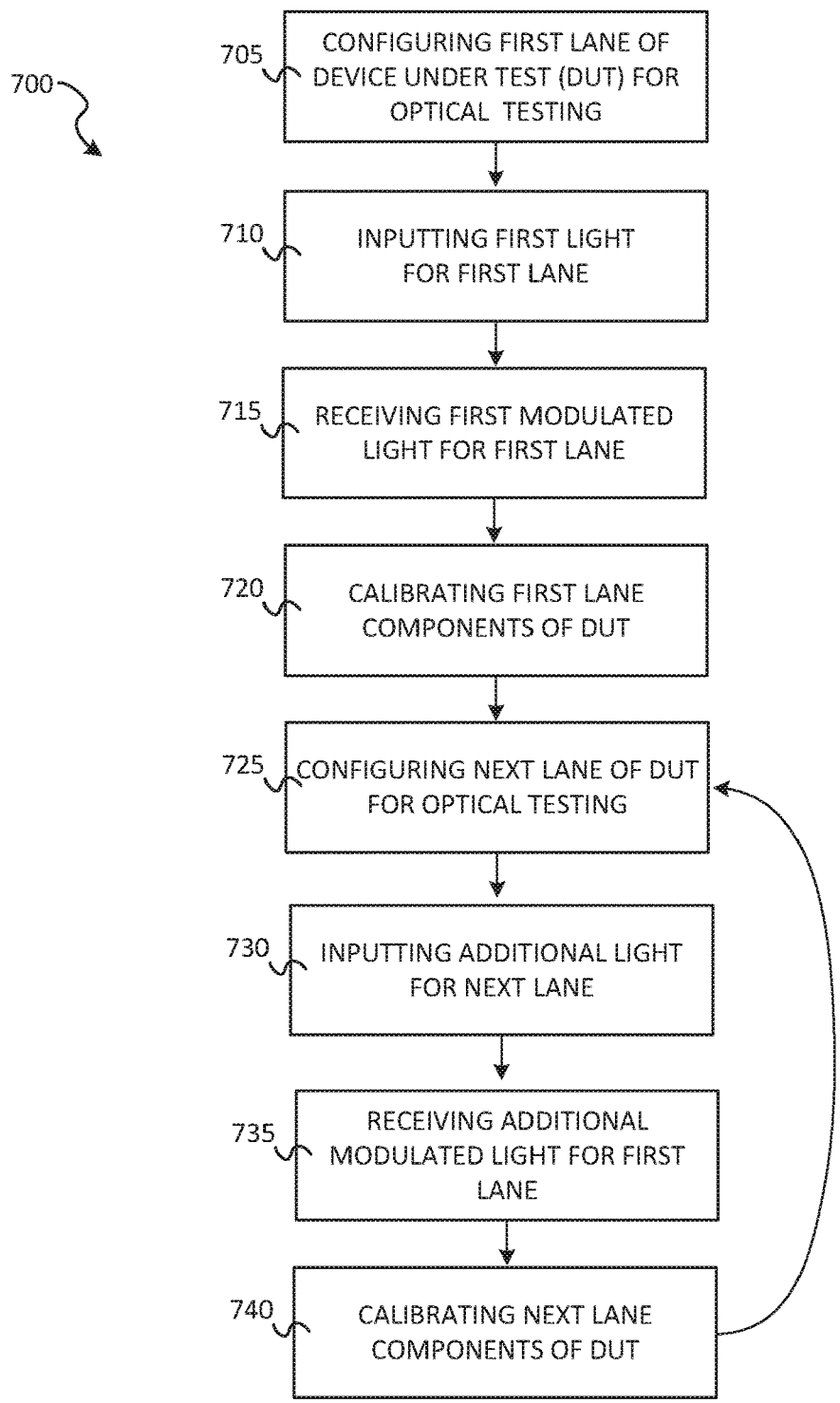
FIG. 7 shows a flow diagram of a method for a multilane hybrid ATE testing of an optical-electrical device under test, according to some example embodiments.

FIG. 7 shows a flow diagram of a method 700 for a multilane hybrid ATE testing of an optical-electrical device under test, according to some example embodiments. At operation 705, the optical test assembly 130 is configured to perform optical testing of the first lane of the device under test. For example, the optical test assembly 130 configures the light source 505 to generate light for the first lane and further configures the optical switch 503 to couple light from output fiber 530A to the testing fiber 535.

At operation 710, a light source inputs light for the first lane into the device under test. For example, the first lane light from the light source 505 is injected into the device under test using the optical interconnect interface 600 which has been passively aligned using alignment features as discussed above. In some example embodiments, the light source is integrated in the device under test and operation 710 is omitted. For example, a light source within the DUT 120 is activated to generate light for testing (e.g., modulation, analysis).

At operation 715, first modulated light from the first lane is received. For example, the first modulated light is received from the DUT 120 via the optical interconnect interface onto the output fiber 530A which is input into the optical switch 503 which is configured to transmit the light to the optical test device 513 via the testing fiber 535.

At operation 720, the optical test assembly 130 calibrates first lane components of the device under test (e.g., calibrates optical modulators of the first lane using optical test devices, calibrates electrical heaters of the first lane according to one or more electrical test devices).

At operation 725, the optical test assembly 130 configures the next lane of the device under test for hybrid optical and electrical testing. For example, at operation 725, the optical test assembly 130 configures the optical switch 503 to couple output fiber 530B to the testing fiber 535 and further configures the light source 505 to generate light on the input fiber 52B for injection into the second lane components of the device under test.

At operation 730, light from the light source for the additional Lane (e.g. second lane) is input into the device under test. For example, light propagating on fiber 525A is input into the DUT 120 using the optical interconnect interface 600 that is passively aligned. At operation 735, the additional modulated light from the additional lane is received. For example, a second lane of modulated light is received via the optical interconnect interface 600 which outputs the light on output fiber 530B and into the testing device via the optical switch 503 and the testing fiber 535. In some example embodiments, operation 720 may be omitted from method 700 (e.g., the DUT 120 includes embedded light sources for the different lanes).

At operation 740, while in the second configuration, one or more electrical or optical components used to modulate light of the second lane are tested and calibrated and calibration settings are stored on-device (e.g., in microcontroller memory of the DUT). In some example embodiments, the method 700 loops for additional lanes of the multilane DUT 120 (e.g., a third lane, a fourth lane).

The following are example embodiments:

Example 1. A method for testing of an optical-electrical device under test (DUT) using an automated testing equipment (ATE) system, the method comprising: configuring an optical test lane switch selector in a first configuration for optical testing of a first lane of the optical-electrical DUT, the optical-electrical DUT being a multilane optical transceiver comprising a plurality of transceiver lanes including the first lane and a second lane, each lane of the plurality of transceiver lanes modulating light using an optical transmitter for the lane and receiving light using an optical receiver for the lane, the optical test lane switch selector being configured for the first configuration by selecting, using an optical switch in the optical test, lane switch selector, one of a plurality of output, fibers coupled to the optical-electrical DUT to a testing fiber that is coupled to an optical testing device, the optical test lane switch selector being further configured in the first configuration by activating an external light source in the optical test lane switch selector to transmit light to the optical-electrical DUT on one of a plurality of input fibers that are coupled to the optical-electrical DUT the one of the plurality of output fibers and the one of the plurality of input fibers corresponding to the first lane of the multilane optical transceiver; calibrating one or more optical components of the first lane of the optical-electrical DUT while the optical test lane switch selector is in the first configuration, the one or more optical components calibrated according to data generated by the optical testing device using the light coupled into the testing fiber by the optical switch in the first configuration; configuring the optical test lane switch selector in a second configuration for optical testing of a second lane of the optical-electrical DUT, wherein the second lane is another lane of the plurality of transceiver lanes, the optical test lane switch selector being configured for the second configuration by selecting, using the optical switch in the optical test lane switch selector, another of the plurality of output fibers coupled to the optical-electrical DUT to the testing fiber that is coupled to the optical testing device, the optical test lane switch selector being further configured in the second configuration by activating the external light source of the optical test lane switch selector to transmit light to the optical-electrical DUT on another of the plurality of input fibers that are coupled to the optical-electrical DUT, the another of the plurality of output fibers and the another of the plurality of input fibers corresponding to the second lane of the multilane optical transceiver; and calibrating one or more optical components of the second lane of the optical-electrical DUT while the optical test lane switch selector is in the second configuration, the one or more optical components calibrated according to additional data generated by the optical testing device using the light that is coupled to the testing fiber by the optical test lane switch selector in the second configuration.

Example 2. The method of example 1, wherein the external light source comprises a plurality of light sources, and wherein in the first configuration a first light source of the plurality of light sources generates a first light for the first lane, and wherein in the second configuration a second light source of the plurality of light sources generates a second light for the second lane.

Example 3. The method of example 1 or 2, wherein the external light source comprises a broadband light source that is tunable to different wavelengths, the broadband light source generating light for first lane while in the first configuration, the broadband light source generating light for the second lane while in the second configuration.

Example 4. The method of any of examples 1-3, wherein the optical switch is a mechanical switch that is reconfigurable to select one of a plurality of fibers coupled to a plurality of input ports of the optical switch to an output port of the optical switch.

Example 5. The method of any of examples 1-4, further comprising: configuring the optical test lane switch selector in a third configuration for optical testing of a third lane of the optical-electrical DUT, wherein the third lane is another lane of the plurality of transceiver lanes, the optical test lane switch selector been configured for the third configuration by selecting, using the optical switch, one of the other of the plurality of output fibers coupled to the optical-electrical DUT to the testing fiber that is coupled to the optical testing device, the optical test lane switch selector being further configured in the third configuration by activating the external light source to transmit light to one of the other of the plurality of the input fibers are coupled to the optical-electrical DUT, the one of the other of the plurality of output fibers in the one of the other of the plurality of input fibers corresponding to a third lane of the optical-electrical DUT.

Example 6. The method of any of examples 1-5, further comprising: calibrating one or more optical components of the third lane of the optical-electrical DUT while the optical test lane switch selector is in the third configuration, the one or more optical components calibrated according to further data generated by the optical testing device using the light is coupled into the testing fiber by the optical test lane switch selector in the third configuration.

Example 7. The method of any of examples 1-6, wherein the plurality of output fibers in the plurality of input fibers are coupled to the optical-electrical DUT using an optical interconnect structure comprising alignment features that align optical output and input paths of the optical-electrical DUT with each of the plurality of output fibers in the plurality of input fibers.

Example 8. The method of any of examples 1-7, wherein the optical interconnect structure comprises one or more lenses that direct the light from the plurality of output fibers in the plurality of input fibers to the optical-electrical DUT.

Example 9. The method of any of examples 1-8, wherein the optical interconnect structure comprises a socket affixed to the optical-electrical DUT, the socket comprising additional alignment features that interlock with the alignment features.

Example 10. The method of any of examples 1-9, wherein the socket comprises a grating coupler to propagate light from the optical interconnect structure coupled from the plurality of output fibers or the plurality of input fibers.

Example 11. The method of any of examples 1-10, wherein the ATE system comprises one or more electronic testing modules for testing electrical components of the optical-electrical DUT.

Example 12. The method of any of examples 1-11, further comprising: calibrating, while the optical test lane switch selector is in the first configuration, a first set of electrical components of the first lane of the multilane optical transceiver while the optical testing device calibrates the one or more optical components of the first lane of the optical-electrical DUT.

Example 13. The method of any of examples 1-12, further comprising: calibrating, while the optical test lane switch selector is in the second configuration, a second set of electrical components of the second lane of the optical-electrical DUT while the optical test device generates calibration data for the one or more optical components of the second lane of the optical-electrical DUT.

Example 14. The method of any of examples 1-13, wherein the optical testing device is an optical spectrum analyzer.

Example 15. The method of any of examples 1-14, wherein the optical testing device is an optical power meter.

Example 16. An automated testing equipment (ATE) system for testing of an optical-electrical device under test (DUT), the ATE system comprising: an optical testing device to generate calibration data using light received from a testing fiber that is coupled to the optical-electrical DUT; and an optical test lane switch selector that, in a first configuration, tests a first lane of the optical-electrical DUT, the optical-electrical DUT being a multilane optical transceiver comprising a plurality of transceiver lanes including the first lane and a second lane, each lane of the plurality of transceiver lanes modulating light using an optical transmitter for the lane and receiving light using an optical receiver for the lane, the optical test lane switch selector being configured for the first configuration by selecting, using an optical switch in the optical test lane switch selector, one of a plurality of output fibers coupled to the optical-electrical DUT to a testing fiber that is coupled to an optical testing device, the optical test lane switch selector being further configured in the first configuration by activating an external light source in the optical test lane switch selector to transmit light to the optical-electrical DUT on one of a plurality of input fibers that are coupled to the optical-electrical DUT the one of the plurality of output fibers and the one of the plurality of input fibers corresponding to the first lane of the multilane optical transceiver, wherein the optical test lane switch selector, in a second configuration, tests a second lane of the optical-electrical DUT, wherein the second lane is another lane of the plurality of transceiver lanes, the optical test lane switch selector being configured for the second configuration by selecting, using the optical switch in the optical test lane switch selector, another of the plurality of output fibers coupled to the optical-electrical DUT to the testing fiber that is coupled to the optical testing device, the optical test lane switch selector being further configured in the second configuration by activating the external light source of the optical test lane switch selector to transmit light to the optical-electrical DUT on another of the plurality of input fibers that are coupled to the optical-electrical DUT, the another of the plurality of output fibers and the another of the plurality of input fibers corresponding to the second lane of the multilane optical transceiver.

Example 17. The ATE system of example 16, wherein the external light source comprises a plurality of light sources, and wherein in the first configuration a first light source of the plurality of light sources generates a first light for the first lane, and wherein in the second configuration a second light source of the plurality of light sources generates a second light for the second lane.

Example 18. The ATE system of any of examples 16 or 17, wherein the optical switch is a mechanical switch that is reconfigurable to select one of a plurality of fibers coupled to a plurality of input ports of the optical switch to an output port of the optical switch.

Example 19. The ATE system of any of examples 16-18, wherein the plurality of output fibers in the plurality of input fibers are coupled to the optical-electrical. DUT using an optical interconnect structure comprising alignment features that align optical output and input paths of the optical-electrical DUT with each of the plurality of output fibers in the plurality of input fibers.

Example 20. The ATE system of any of examples 16-19, wherein the optical testing device is an optical spectrum analyzer.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method comprising:
    actuating, using a handler of an automated testing system, an optical-electrical device to connect to an electric testing module of the automated testing system and to connect to an optical testing module of the automated testing system, the optical-electrical device connected to the electric testing module of the automated testing system using electrical connections while the optical-electrical device is connected to the optical testing module of the automated testing system using optical connections:
    configuring an optical test lane switch selector in a first configuration for optical testing of a first lane of the optical-electrical device;
    calibrating one or more optical components of the first lane of the optical-electrical device using the optical testing module while the optical test lane switch selector is in the first configuration and while one or more electrical components of the optical-electrical device are electrically connected to the electrical testing module;
    configuring the optical test lane switch selector in a second configuration for optical testing of a second lane of the optical-electrical device; and
    calibrating one or more other optical components of the second lane of the optical-electrical device using the optical testing module while the optical test lane switch selector is in the second configuration and while the one or more electrical components of the optical-electrical device are electrically connected to the electrical testing module.

2. The method of claim 1, further comprising:
generating a first light and a second light using an external light source that comprises a plurality of light sources, wherein in the first configuration a first light source of the plurality of light sources generates the first light for the first lane, and wherein in the second configuration a second light source of the plurality of light sources generates the second light for the second lane.

3. The method of claim 1, further comprising:
generating a first light and a second light using an external light source that comprises a plurality of light sources, wherein the external light source comprises a broadband light source that is tunable to different wavelengths, the broadband light source generating the first light for the first lane while in the first configuration, the broadband light source generating the second light for the second lane while in the second configuration.

4. The method of claim 1, wherein the optical test lane switch selector comprises an optical switch to switch lanes.

5. The method of claim 1, further comprising:
configuring the optical test lane switch selector in a third configuration for optical testing of a third lane of the optical-electrical device, wherein the third lane is another lane of a plurality of transceiver lanes of the optical-electrical device, the optical test lane switch selector been configured for the third configuration by selecting, using the optical test lane switch selector, one of a set of output fibers coupled to the optical-electrical device to a testing fiber that is coupled to optical testing module, the optical test lane switch selector being further configured in the third configuration by activating an external light source to transmit light to one or more input fibers of the optical connections that are coupled to the optical-electrical device.

6. The method of claim 5, further comprising:
calibrating one or more additional optical components of the third lane of the optical-electrical device while the optical test lane switch selector is in the third configuration, the one or more optical components calibrated according to further data generated by the optical testing module using light that is coupled into the testing fiber by the optical test lane switch selector in the third configuration.

7. The method of claim 1, wherein the optical connections comprises input fibers that input light into the optical-electrical device and output fibers that receive light returned from the optical-electrical device, wherein the optical connections further comprise one or more lenses that direct the light from the output fibers and the input fibers to the optical-electrical device.

8. The method of claim 1, wherein the optical connections comprise an optical socket affixed to the optical-electrical device, the optical socket comprising additional alignment features that interlock with physical interlocking features.

9. The method of claim 8, wherein the optical socket comprises a grating coupler to propagate light with input fibers and output fibers of the optical connections.

10. The method of claim 1, further comprising:
calibrating, while the optical test lane switch selector is in the first configuration, a first set of electrical components of the first lane of the optical-electrical device while the optical testing module calibrates the one or more optical components of the first lane of the optical-electrical device.

11. The method of claim 10, further comprising:
calibrating, while the optical test lane switch selector is in the second configuration, a second set of electrical components of the second lane of the optical-electrical device while the optical testing module generates calibration data for the one or more optical components of the second lane of the optical-electrical device.

12. The method of claim 1, wherein the optical testing module is an optical spectrum analyzer.

13. The method of claim 1, wherein the optical testing module is an optical power meter.

14. An automated testing system for testing of an optical-electrical device, the automated testing system comprising,
a handler to actuate the optical-electrical device to connect to an electric testing module of the automated testing system and connect to an optical testing module of the automated testing system, the optical-electrical device connected to the electric testing module of the automated testing system using electrical connections while the optical-electrical device is connected to the optical testing module of the automated testing system using optical connections; and
an optical test lane switch selector that is configurable in a first configuration for optical testing of a first lane of the optical-electrical device and configurable in a second configuration for optical testing of a second lane of the optical-electrical device, wherein in the first configuration one or more optical components of the first lane of the optical-electrical device are calibrated using the optical testing module while one or more electrical components of the optical-electrical device are electrically connected to the electrical testing module, wherein in the second configuration one or more other optical components of the second lane of the optical-electrical device are calibrated using the optical testing module while the one or more electrical components of the optical-electrical device are electrically connected to the electrical testing module.

15. The automated testing system of claim 14, wherein an external light source that comprises a plurality of light sources generates a first light and a second light, wherein in the first configuration a first light source of the plurality of light sources generates the first light for the first lane, and wherein in the second configuration a second light source of the plurality of light sources generates the second light for the second lane.

16. The automated testing system of claim 14, wherein an external light source that comprises a plurality of light sources generates a first light and a second light, wherein the external light source comprises a broadband light source that is tunable to different wavelengths, the broadband light source generating the first light for the first lane while in the first configuration, the broadband light source generating the second light for the second lane while in the second configuration.

17. The automated testing system of claim 14, wherein while the optical test lane switch selector is in the first configuration, a first set of electrical components of the first lane of the optical-electrical device are calibrated while the optical testing module calibrates the one or more optical components of the first lane of the optical-electrical device.

18. The automated testing system of claim 14, wherein while the optical test lane switch selector is in the second configuration, a second set of electrical components of the second lane of the optical-electrical device are calibrated while the optical testing module generates calibration data for the one or more optical components of the second lane of the optical-electrical device.

19. The automated testing system of claim 14, wherein the optical testing module is an optical spectrum analyzer.

20. The automated testing system of claim 14, wherein the optical testing module is an optical power meter.

\* \* \* \* \*